United States Patent
Danielsson

(10) Patent No.: US 6,878,942 B2
(45) Date of Patent: Apr. 12, 2005

(54) METHOD AND APPARATUS FOR DETECTING X-RAYS

(75) Inventor: Mats Danielsson, Täby (SE)

(73) Assignee: Sectra Mamea AB, Kista (SE)

( * ) Notice: Subject to any disclaimer, the term of this patent is extended or adjusted under 35 U.S.C. 154(b) by 0 days.

(21) Appl. No.: 09/682,502

(22) Filed: Sep. 10, 2001

(65) Prior Publication Data

US 2002/0017609 A1 Feb. 14, 2002

Related U.S. Application Data

(63) Continuation of application No. PCT/SE00/00488, filed on Mar. 10, 2000.

(30) Foreign Application Priority Data

Mar. 10, 1999 (SE) .............................................. 9900856

(51) Int. Cl.[7] .................................................. G01T 1/24
(52) U.S. Cl. .................................. 250/370.09; 250/371
(58) Field of Search ...................... 250/370.09, 370.06, 250/370.08, 370.12, 370.13, 371

(56) References Cited

U.S. PATENT DOCUMENTS

| 4,317,037 | A | * | 2/1982 | Suzuki et al. .......... | 250/370.11 |
|---|---|---|---|---|---|
| 4,937,453 | A | | 6/1990 | Nelson | |
| 5,227,635 | A | | 7/1993 | Iwanczyk | |
| 5,434,417 | A | * | 7/1995 | Nygren ................... | 250/370.01 |
| 5,596,200 | A | * | 1/1997 | Sharma et al. ......... | 250/370.14 |
| 5,744,806 | A | * | 4/1998 | Frojd ..................... | 250/370.09 |
| 5,821,540 | A | * | 10/1998 | Sato et al. ............. | 250/370.06 |
| 5,847,398 | A | | 12/1998 | Shahar et al. | |
| 2002/0018543 | A1 | * | 2/2002 | Danielsson ................ | 378/98.8 |

FOREIGN PATENT DOCUMENTS

| DE | 19618465 C1 | | 6/1997 | | |
|---|---|---|---|---|---|
| FR | 2 705 791 A1 | * | 12/1994 | ............. | G01T/1/24 |
| JP | 59099384 | | 10/1984 | | |
| JP | 63-098582 A | * | 4/1988 | ............. | 250/370.13 |
| JP | 5072150 A | | 3/1993 | | |
| JP | 63117286 | | 6/2000 | | |
| WO | WO 00/54072 A1 | * | 9/2000 | ............. | G01T/1/24 |

* cited by examiner

*Primary Examiner*—Albert Gagliardi
(74) *Attorney, Agent, or Firm*—Novak Druce & Quigg LLP

(57) ABSTRACT

The present invention relates to a method of detecting X-rays for obtaining improved radiographic images including a step of orienting a semiconductor radiation detector whose height is greater than its thickness. The orienting step comprises a selection of an acute angle between a direction of incident radiation and a side of said detector having said height such that said incident radiation mainly hit the side of said radiation detector. The hit area excludes at least a section between at least one edge of said detector and at least an active sensor area and that substantially all of the energy of the radiation is dissipated within the detector.

9 Claims, 3 Drawing Sheets

METHOD AND APPARATUS FOR DETECTING X-RAYS

CROSS REFERENCE TO RELATED APPLICATIONS

This application is a continuation of International Application No. PCT/SE0/00488, filed 10 Mar. 2000, which claims priority to Swedish Application No. 9900856-7, filed 10 Mar. 1999. The full disclosure of said applications, in their entireties, are hereby expressly incorporated by reference into the present application.

BACKGROUND OF INVENTION

1. Technical Field

The present invention relates to a method of detecting X-rays for obtaining improved radiographic images ranging from about 10 keV to about 50 keV. The invention also relates to an apparatus for detection of incident radiation for radiographic imaging for applications ranging from about 10 keV to about 50 keV. Further, the invention relates to the use of such an apparatus for detecting incident radiation in scanned-slot medical imaging.

2. Background Information

In medical X-ray imaging, the central problem is achieving the best possible image at the lowest possible radiation dose. In order to accomplish this, high detection efficiency for all X-ray photons passing through the patient is crucial. Current X-ray imaging systems work with Detection Quantum Efficiencies ("DQE") ranging from 10% to around 60%.

Silicon is in many ways the ideal detector material. Advantages of silicon include the high quality and purity of the crystal, and its very low cost due to research and development in the semiconductor industry and the large volumes of silicon used.

However, silicon is not advantageous for use in that its low atomic number corresponds to a decrease in stopping power for higher energy X-rays. A silicon detector wafer can be made with a maximum thickness of only around 1 mm, with the standard thickness about half of that. Thicker detectors require application of prohibitively high voltages to deplete the whole detector volume and become an efficient X-ray detector, if the X-rays are incident at a right angle to the surface. This corresponds to an efficiency of only 25% at 20 keV.

A solution to this problem is to orient the detector edge-on to the incident beam. In this geometry, the thickness of the silicon stopping the X-rays can be large enough to stop virtually all incident X-rays. This method is outlined in the invention described in U.S. Pat. No. 4,937,453 to Robert S. Nelson ("Nelson"). Edge-on detection for increased efficiency is also conceivable for other semiconductor detectors, but is particular important in the case of silicon because of the limited stopping power of this material due to its lightness.

A problem not anticipated in the method and device described in Nelson is that the semiconductor detector is typically mechanically damaged in a zone close to the edge when it is cut. The cutting is usually performed with a diamond saw or a laser. In this area, a large amount of background current is generated. The active sensors in the semiconductor wafer have to be placed some distance from the edge in order not to be saturated by this background current, which mask the signal from the X-rays. As a solution, the present invention includes one or several guard-rings that are placed between at least one of the active sensors and at least one of the edges in order to sink the current generated at the edge of the detector, thereby preventing it from reaching the active sensors. The distance between the edge and the active sensors are from 0.1 mm to 0.6 mm. X-rays stopping in this region will not be detected. This so-called dead area is equivalent to an inefficiency in the order of 20% in diagnostic X-ray imaging, such as mammography.

The loss of information is even more serious since the majority of the low energy photons that carry the most contrast information to the image will stop in the region close to the edge, which is not an active detector volume, while the high energy photons, with less contrast information, tend to penetrate further down into the detector.

According to DE 19 61 84 65, a detector array is taught having a number of detectors, each provided by a semiconductor plate of a directly converging semiconductor material with an electrode layer on two opposing sides. At least two detectors lie adjacent to one another, vertical to a surface receiving the incident radiation, with the main surfaces of the detectors set at an angle of between zero and 90 degrees to the latter surface. Separators of a radiation absorbing material are inserted between the detectors. The fundamental idea is to extend the length of the path of the incident radiation to the semiconductor detectors without increasing the distance between the electrodes. Moreover, the detector arrangement is intended for high energy radiation and is provided to detect Compton radiation.

JP 50732150 provides an arrangement for reducing manufacturing cost and improve SN, measurement precision, and using performance. An X-ray inspecting device is equipped with an X-ray source for irradiating X rays onto a sample in revolution, with a collimator having slits formed in radial form, in order to draw the X-ray which permeate the sample is arranged. A semiconductor detector for detecting the X-rays by a sensing part through the radiation of the X-ray beam from the slit is also provided. Since the X-ray inspection device is installed at an angle other than a nearly right angle to the plane parallel to the vertical direction revolution axis center of the semiconductor inspection part and the sample, and it is installed at an inclination of an angle incident to the extension line of the X-ray beam, the irradiation of the scattered X-ray due to the sample into the semiconductor detector is prevented, and the X-ray beam supplied from the slit can be irradiated on the whole surface or a part of the sensing part. Also, this arrangement is for high radiation applications.

SUMMARY OF INVENTION

The present invention provides a method for detecting X-rays which solves the above mentioned problems by providing a method of detecting X-rays for obtaining improved radiographic images ranging from about 10 keV to about 50 keV.

The invention further provides an apparatus for detecting X-rays for detection of incident radiation for radiographic imaging, for applications ranging from about 10 keV to 50 keV. The invention also provides for a use of this apparatus for detection of incident radiation in scanned-slot medical imaging.

The present invention enables a DQE close to about 100% for energies of interest in diagnostic X-ray imaging ranging from about 10 keV to about 50 keV, combined with a high spatial resolution.

Further, the present invention is very simple and inexpensive to implement in a detector.

The detector depth of the present invention can be made large without having the X-rays passing the dead area close to the edge.

The present invention also improves the X-ray image and/or lowers the radiation dose for the patient.

BRIEF DESCRIPTION OF DRAWINGS

The invention will be described in more detail below with reference to examples shown in the accompanying drawings, where.

DETAILED DESCRIPTION

A silicon detector is fabricated from a raw silicon wafer that is exposed to different treatments to get the desired resistivity and other material parameters and the pattern of silicon strip sensors defining the individual pixels in the detector is fabricated through standard photolithographic techniques.

Figure 1:
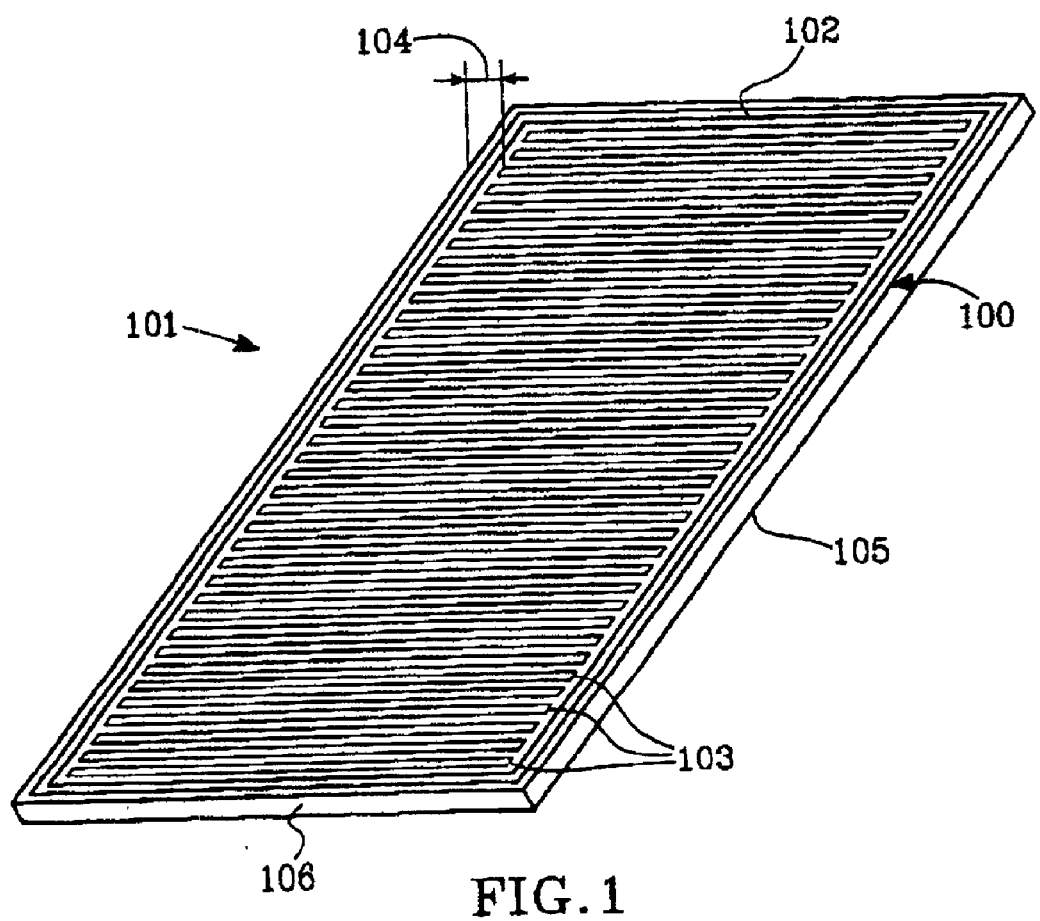
FIG. 1 illustrates a top perspective view of one embodiment of a detector chip according to the present invention.

In FIG. 1 a perspective view of a detector chip 101 is shown, with a guard ring 102 indicated together with individual pixel sensors 103 on the front side of the detector 101, or with the strips for the top contact for the individual diodes. Bond pads for each strip for connection to the electronics are not indicated. The size of the pixel sensors is mainly determined by the demands on spatial resolution for a certain imaging task.

In applications such as mammography, the distance between two adjacent pixels should be of the order of about 25 µm to about 100 µm. The dead area 104 corresponds to the distance from the edge of the detector to somewhere approximately between where the guard ring 102 and strips 103 start. Wafer thickness normally ranges from about 300 µm to about 500 µm. To deplete the whole volume of the detector, a bias voltage is applied between the back of the detector 105 that is usually entirely covered with aluminum. The depletion can, for example, be achieved with a +80 V connection to the backside of the detector wafer. The pixel sensors can then be at ground and connected to electronics. In this case, holes created by incident X-rays are collected by the electronics. With an inverse diode structure for the sensor pixels and −80 V connected to the back of the detector, the electrons would be collected by the electronics, working equally well. The bias voltage necessary to deplete the whole wafer is dependent on the individual detector type and thickness, and ranges from about 10 V to over 1000 V.

The electronics, usually in terms of Application Specific Integrated Circuits, for collecting and processing signals from the individual sensor pixels are connected to the individual sensor pixels through standard interconnection techniques, such as wire bonding or bump bonding. Pads usually necessary for these interconnections are not indicated in FIG. 1, but should be situated close to the end 106 of the strips 103.

Figure 2:
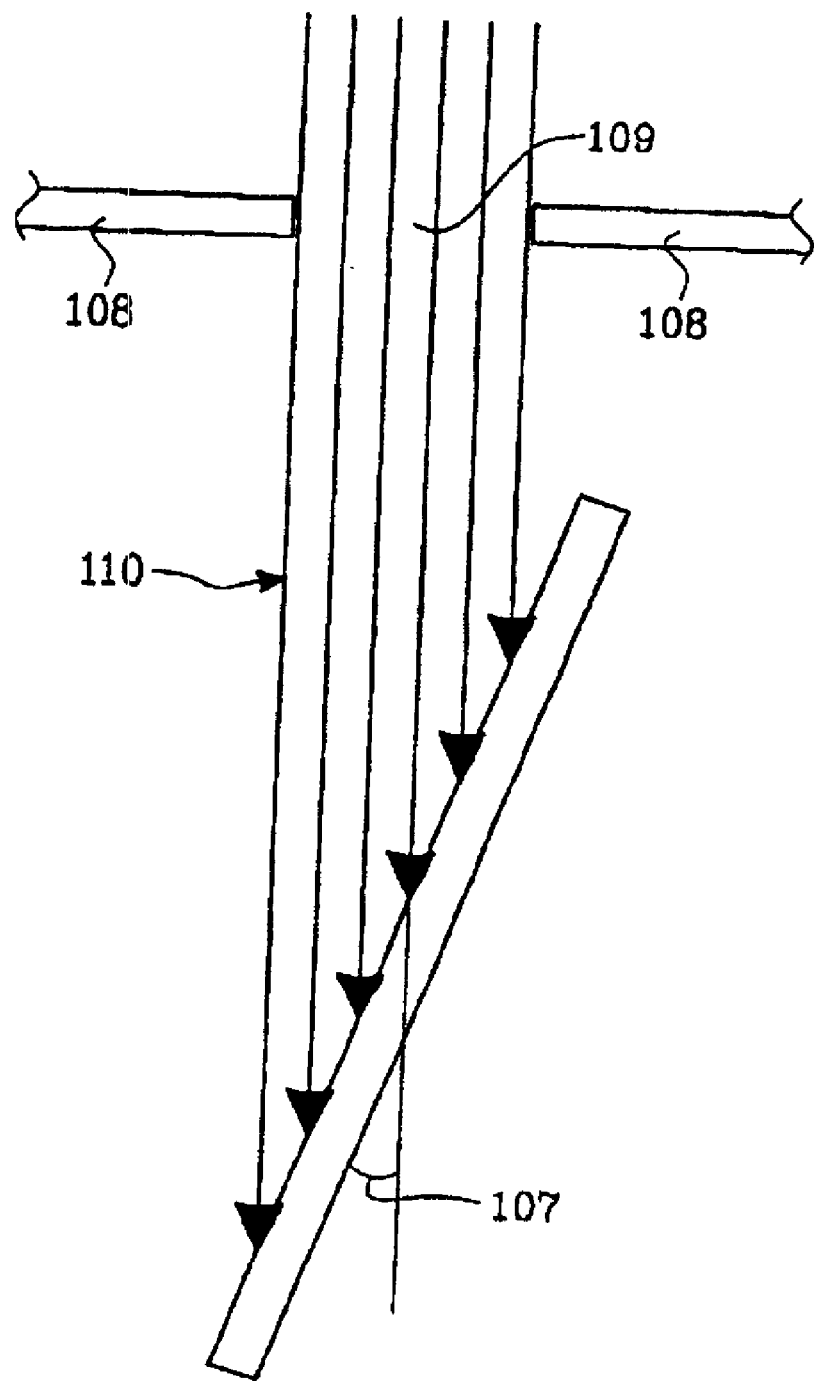
FIG. 2 illustrates a side view of a detector according to the present invention with incoming X-rays and a collimator defining the shape of the X-ray beam.

According to the present invention, there is a geometry between the incident X-rays and the detector such that the inefficiency mentioned above disappears. FIG. 2 shows a detector that is slightly tilted with respect to the incident X-rays in order to make them hit the detector at a small angle to the detector surface.

To achieve maximum detection efficiency, e.g., for mammography, bone densitometry or non-destructive testing, the detector should be oriented relative to the incident X-rays, as illustrated in FIG. 2, with a certain angle 107 between the detector surface and the X-rays. The collimator 108 shapes the X-ray beam to match the detector area, or active area. By changing the angle of the incident X-rays relative to the surface of the detector, the thickness of silicon that the X-ray encounters is determined. The detection efficiency is in turn determined by the thickness of the silicon. The detection efficiency can thus be selected to meet requirements for a particular imaging task. For example, assuming a wafer thickness of 0.3 mm and an X-ray energy of 25 keV, typical for mammography, we will, with an angle of about 2.8 degrees, achieve a detection efficiency in silicon exceeding 90%. In this case, if the collimator slot 109 defining the shape of the incident X-rays has a width of about 50 µm, this would require an overall length of the detector of around 10 mm. Incident X-rays will encounter around 7.5 mm of silicon. A larger angle would result in a slightly decreased detection efficiency, but require a shorter detector. Moreover, dead area is excluded from the radiation.

For a detector of about 0.5 mm thickness, the same performance is achieved with a slightly larger angle of around 3.8 degrees. Also, fairly large angles of about 10 degrees results in as much as about 3 mm of silicon depth for any incident X-rays. This yields an efficiency that is high enough for several applications at lower energies. For example, for 20 keV, it would exceed 85% efficiency. If the collimator is wider, e.g., 100 µm, the detector is made longer in order to cover substantially all the area under the collimator slot 109.

There is a choice in whether to have the front side of the detector 101 or the back side of the detector 105 face the incoming X-rays. Either scheme works quite well, but it is preferred to have the backside of the detector facing the X-rays. The reason for this is that the depletion zone, i.e., the active detector volume, does not extend all the way to the edge of the detector also in this direction, even if the dead area is much smaller, approximately of the order 1 µm compared to the edge-on case. Since the extension of this dead area is less thick on the back side due to less processing of the detector having taken place here, it is advantageous to have the X-rays incident to the back side of the detector as this yields a slightly increased efficiency.

In a system according to the present invention, the X-ray imaging object is placed between two collimator slots that are aligned with respect to each other and look more or less identical. The first collimator shapes the X-ray beam to match the active detector area. The second collimator slot removes Compton scattered X-rays. The detector is positioned after this collimator slot.

Figure 3:
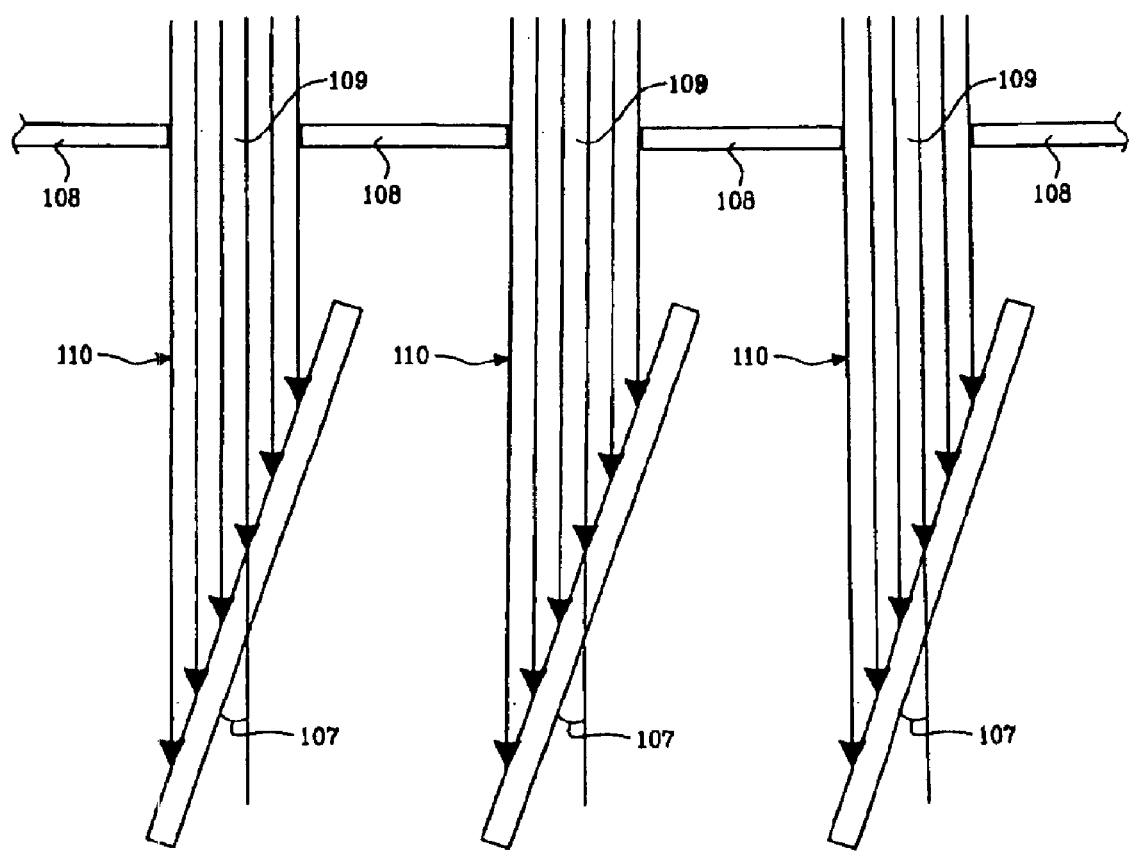
FIG. 3 illustrates a sideview of a detector according to the present invention having multiple detectors and collimators.

One important extension of the scheme above is to place several collimator slots and corresponding detectors after each other as is shown in FIG. 3. This increases image acquisition time, since the area where X-rays are detected is increased. In FIG. 2, this corresponds to placing similar detectors and slots to the left and/or right of the indicated slot and detector. It may also be advisable to put an X-ray absorbing metal plate between different detectors in this scheme to prevent scattered X-rays from reaching adjacent detectors.

Semiconductors other than silicon, such as gallium arsenide or CdZnTe, could be used in the scheme above instead of silicon. However, they are more expensive and difficult to work with. Further, parameters such as charge collection efficiency for the charge induced by the X-rays are not good as for Silicon.

Although the present invention has been described and illustrated in detail, it is to be clearly understood that the same is by way of illustration and example only, and is not to be taken as a limitation. For example, the apparatus and method can be implemented in various ways depending on factors such as application, functional units, needs and requirements.

What is claimed is:

1. An x-ray imaging arrangement for obtaining diagnostic radiographic images, said arrangement comprising:

an x-ray emission source located at a spaced-apart distance from an x-ray detector and an x-ray beam collimator positioned between said x-ray emission source and said x-ray detector;

a silicon substrate based radiation detector comprising a silicon detector wafer having a mechanically damaged edge zone characterized by the production of interfering background current during radiation detection;

a plurality of pixel sensor strips being arranged on said silicon detector wafer, each at a spaced-apart, lateral distance from said mechanically damaged edge zone, said plurality of pixel sensor strips collectively defining a substantially planar active x-ray detection area of said silicon detector wafer;

a guard ring being at least partially located laterally between said pixel sensor strips and said mechanically damaged edge zone and thereby establishing a dead area of said silicon detector wafer extending interiorly from said guard ring toward said pixel sensor strips; and said collimator being configured to pass an x-ray beam having a cross-sectional area measured perpendicular to said x-ray beam smaller than said active x-ray detection area.

2. The invention as recited in claim 1, wherein said substantially planar active x-ray detection area is oriented at an angle with respect to said x-ray beam so that no x-rays impinge upon said dead area.

3. The invention as recited in claim 2, wherein said plurality of pixel sensor strips are arranged with approximately 25 $\mu$m to 100 $\mu$m distance between adjacent pixel sensor strips whereby said x-ray imaging arrangement constitutes a means for producing mammography diagnostic radiographic images.

4. The invention as recited in claim 3, wherein said thickness of said silicon detector wafer is approximately 300 $\mu$m and said x-ray emission source emits x-ray energy at approximately 25 keV.

5. The invention as recited in claim 4, wherein said substantially planar active x-ray detection area is oriented at approximately 87 degrees with respect to said x-ray beam.

6. The invention as recited in claim 3, wherein said detector is connected to an applied bias voltage of approximately ±80 V.

7. The invention as recited in claim 6, wherein said applied bias voltage ranges between approximately 10 V and 1000 V.

8. The invention as recited in claim 2, wherein said thickness of said silicon detector wafer ranges between approximately 300 $\mu$m to 500 $\mu$m.

9. The invention as recited in claim 1, wherein all of said plurality of pixel sensor strips in said detector are arranged at a single, substantially uniform level with respect to said silicon detector wafer without overlap with other pixel sensor strips.

* * * * *